(12) United States Patent
Yang et al.

(10) Patent No.: US 12,219,695 B2
(45) Date of Patent: Feb. 4, 2025

(54) CIRCUIT BOARD AND MANUFACTURING METHOD THEREOF, AND TERMINAL DEVICE

(71) Applicant: Honor Device Co., Ltd., Shenzhen (CN)

(72) Inventors: Junjie Yang, Shenzhen (CN); Erliang Li, Shenzhen (CN); Jian Bai, Shenzhen (CN); Xiaohang Li, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/041,767

(22) PCT Filed: Aug. 26, 2022

(86) PCT No.: PCT/CN2022/115228
§ 371 (c)(1),
(2) Date: Feb. 15, 2023

(87) PCT Pub. No.: WO2023/071486
PCT Pub. Date: May 4, 2023

(65) Prior Publication Data
US 2024/0138056 A1  Apr. 25, 2024
US 2024/0237194 A9  Jul. 11, 2024

(30) Foreign Application Priority Data
Oct. 27, 2021 (CN) .......................... 202111258940.7

(51) Int. Cl.
*H05K 1/11* (2006.01)
*H05K 1/02* (2006.01)
(Continued)

(52) U.S. Cl.
CPC ........... *H05K 1/0268* (2013.01); *H05K 1/116* (2013.01); *H05K 3/3485* (2020.08); *H05K 9/0024* (2013.01); *H05K 2201/035* (2013.01)

(58) Field of Classification Search
CPC ............................. H05K 1/0293; H05K 1/116
See application file for complete search history.

(56) References Cited

U.S. PATENT DOCUMENTS

| 5,017,738 A | 5/1991 | Tsuji et al. |
| 10,355,371 B2 | 7/2019 | Holbery et al. |

(Continued)

FOREIGN PATENT DOCUMENTS

| CN | 108112188 A | 6/2018 |
| CN | 110402492 A | 11/2019 |

(Continued)

*Primary Examiner* — Jeremy C Norris
(74) *Attorney, Agent, or Firm* — Conley Rose, P.C.

(57) ABSTRACT

A circuit board and a manufacturing method thereof, and a terminal device, and relates to the technical field of terminals, to resolve the problem of low reliability of connection between a radio frequency front-end circuit and a radio frequency back-end circuit in a circuit board of a terminal device in a related technology. The circuit board includes a substrate and a liquid metal body, where the substrate is provided with a radio frequency front-end circuit, a radio frequency back-end circuit, and a pad group, where the pad group includes a first pad electrically connected to the radio frequency front-end circuit and a second pad electrically connected to the radio frequency back-end circuit, and the second pad is spaced apart from the first pad; and the liquid metal body is arranged at a position of the pad group and connects the first pad to the second pad.

20 Claims, 10 Drawing Sheets

(51) Int. Cl.
*H05K 3/34* (2006.01)
*H05K 9/00* (2006.01)

(56) References Cited

U.S. PATENT DOCUMENTS

| | | |
|---|---|---|
| 2010/0314735 A1 | 12/2010 | Sheats |
| 2018/0254566 A1 | 9/2018 | Holbery et al. |
| 2019/0123412 A1 | 4/2019 | Michaelis et al. |

FOREIGN PATENT DOCUMENTS

| | | |
|---|---|---|
| CN | 111510170 A | 8/2020 |
| CN | 112595920 A | 4/2021 |
| CN | 213023255 U | 4/2021 |
| JP | 2020173912 A | 10/2020 |

CIRCUIT BOARD AND MANUFACTURING METHOD THEREOF, AND TERMINAL DEVICE

CROSS-REFERENCE TO RELATED APPLICATIONS

This application is a U.S. National Stage of International Application No. PCT/CN2022/115228 filed on Aug. 26, 2022, which claims priority to Chinese Patent Application No. 202111258940.7, filed with the China National Intellectual Property Administration on Oct. 27, 2021, both of which are incorporated herein by reference in their entireties.

TECHNICAL FIELD

This application relates to the technical field of terminals, and in particular, to a circuit board and a manufacturing method thereof, and a terminal device.

BACKGROUND

A radio frequency circuit is an important part in a circuit board of a terminal device such as a mobile phone, and usually includes a radio frequency front-end circuit and a radio frequency back-end circuit. The radio frequency front-end circuit includes a large quantity of components and has a relatively complex composition. Therefore, during actual production of the circuit board, it is required to test the radio frequency front-end circuit to detect quality and soldering problems of components in the radio frequency circuit.

Currently, a radio frequency switch test socket is usually used to test the radio frequency front-end circuit. FIG. 1 is a schematic diagram showing testing of a circuit board of a current terminal device. The circuit board of the terminal device includes a radio frequency front-end circuit 11, a radio frequency back-end circuit 12, and a switch test socket 17 connected between the radio frequency front-end circuit 11 and the radio frequency back-end circuit 12.

During testing of the radio frequency front-end circuit 11, a test end 410 of a radio frequency test instrument 400 is inserted into the switch test socket 17 to disconnect the radio frequency front-end circuit 11 from the radio frequency back-end circuit 12, and the test end 410 is electrically connected to the radio frequency front-end circuit 11 to introduce a signal from the radio frequency front-end circuit 11 into the radio frequency test instrument 400 for testing. After the testing is completed, the test end 410 is pulled out of the switch test socket 17 to reconnect the radio frequency front-end circuit 11 to the radio frequency back-end circuit 12 to ensure a normal function of the circuit board.

However, the radio frequency switch test socket 17 on the foregoing circuit board usually has no other function after the testing is completed, which occupies a layout area on the circuit board, and increases device costs of the terminal device.

To resolve the problem that the radio frequency switch test socket occupies the layout area on the circuit board and has high costs, a related technology discloses a circuit board, in which two pads are used instead of the switch test socket. One of the pads is connected to a radio frequency front-end circuit, and the other is connected to a radio frequency back-end circuit.

During testing of the radio frequency front-end circuit, a test end of a radio frequency test instrument is connected to one of the pads, to introduce a signal from the radio frequency front-end circuit into the radio frequency test instrument for testing. After the testing is completed, serial devices are soldered between the two pads by using a low-temperature reflow soldering process, so that the radio frequency front-end circuit is connected to the radio frequency back-end circuit.

In the circuit board in the related technology, the series devices are soldered between the two pads by using the low-temperature reflow soldering process. Low-temperature solder paste is required for soldering, while high-temperature solder paste is usually used for soldering other devices on the circuit board of the terminal device, which increases a risk of mixing up the solder paste. For example, the high-temperature solder paste may be easily mixed up for soldering during soldering of the series devices, which increases a probability of a soldering defect, and reduces reliability of the connection between the radio frequency front-end circuit and the radio frequency back-end circuit.

SUMMARY

Embodiments of this application provide a circuit board and a manufacturing method thereof, and a terminal device, to resolve the problem of low reliability of connection between a radio frequency front-end circuit and a radio frequency back-end circuit in a circuit board of a terminal device in a related technology.

To achieve the foregoing objective, the following technical solutions are used in the embodiments of this application:

According to a first aspect, an embodiment of this application provides a circuit board, including a substrate and a liquid metal body, where the substrate is provided with a radio frequency front-end circuit, a radio frequency back-end circuit, and a pad group, where the pad group includes a first pad electrically connected to the radio frequency front-end circuit and a second pad electrically connected to the radio frequency back-end circuit, and the second pad is spaced apart from the first pad: and the liquid metal body is arranged at a position of the pad group and connects the first pad to the second pad, so as to electrically connect the radio frequency front-end circuit to the radio frequency back-end circuit.

By using the foregoing technical solution, a process for connection between the first pad and the second pad is simpler, and low-temperature solder paste is not needed for soldering, so that a soldering defect caused by mixing up solder paste is prevented, thereby improving reliability of the connection between the first pad and the second pad, and improving reliability of the connection between the radio frequency front-end circuit and the radio frequency back-end circuit.

In some embodiments, the liquid metal body is arranged on a side that is of the pad group and that is far away from the substrate, and is in contact with the first pad and the second pad.

By using the foregoing technical solution, the liquid metal body is prevented from being in contact with the substrate, thereby reducing a risk that a line on the substrate is short-circuited by the liquid metal body.

In some embodiments, the first pad includes a first pad surface on a side far away from the substrate, and the second pad includes a second pad surface on a side far away from the substrate; and the liquid metal body has a layered structure, and is laminated with the first pad surface and the first pad surface.

By using the foregoing technical solution, when the volume of the liquid metal body is constant, a contact area between the liquid metal body and the first pad surface and a contact area between the liquid metal body and the second pad surface can be increased, thereby reducing impedance of the liquid metal body.

In some embodiments, the first pad surface is flush with the second pad surface.

By using the foregoing technical solution, the first pad and the second pad can be prevented from forming a step, so that the liquid metal body can be easily arranged on the first pad surface and the second pad surface.

In some embodiments, the liquid metal body is flush with a side edge that is of the first pad surface and that is far away from the second pad.

By using the foregoing technical solution, the contact area between the liquid metal body and the second pad surface can be maximized, thereby better reducing the impedance of the liquid metal body.

In some embodiments, the liquid metal body is flush with a side edge that is of the second pad surface and that is far away from the first pad.

By using the foregoing technical solution, the contact area between the liquid metal body and the second pad surface can be maximized, thereby better reducing the impedance of the liquid metal body.

In some embodiments, the circuit board further includes a first insulation layer, and the first insulation layer fills a gap between the first pad and the second pad.

By using the foregoing technical solution, the first insulation layer can support a part that is of the liquid metal body and that is opposite to the gap between the first pad and the second pad, so as to better prevent the liquid metal body from being in contact with the substrate.

In some embodiments, the liquid metal body fills the gap between the first pad and the second pad.

By using the foregoing technical solution, the liquid metal body can be well prevented from being separated from the pad group and moving to another position when the terminal device shakes.

In some embodiments, the circuit board further includes a second insulation layer, and the second insulation layer is arranged at a position of the liquid metal body to cover the liquid metal body.

By using the foregoing technical solution, the liquid metal body can be prevented from being in contact with and short-circuited with an electronic device around the pad group.

In some embodiments, the liquid metal body has a layered structure, and the second insulation layer is stacked on a side that is of the liquid metal body and that is far away from the substrate.

By using the foregoing technical solution, the second insulation layer can be easily arranged on the liquid metal body, so that a contact area between the second insulation layer and the liquid metal body is large, and the second insulation layer will not be easily separated from the liquid metal body.

In some embodiments, the second insulation layer is a heat curing adhesive layer or an ultraviolet curing adhesive layer.

By using the foregoing technical solution, the second insulation layer has a certain mechanical strength, so that the position of the liquid metal body can be well limited at the pad group.

In some embodiments, a plurality of pad groups are provided, and the plurality of pad groups are arranged side by side.

By using the foregoing technical solution, a test end of a radio frequency test instrument can be easily connected to the first pads of the plurality of pad groups, and reliability of connection between the test end and the pad group is improved.

In some embodiments, the circuit board further includes a first shielding can, and the first shielding can covers a region of the substrate provided with the radio frequency front-end circuit.

By using the foregoing technical solution, not only electromagnetic interference of another device on the substrate to the radio frequency front-end circuit during operation can be shielded, but also electromagnetic interference of the radio frequency front-end circuit to another device around during operation can be shielded.

In some embodiments, the circuit board further includes a second shielding can, and the second shielding can covers a region of the substrate provided with the radio frequency back-end circuit.

By using the foregoing technical solution, electromagnetic interference of another device on the substrate to the radio frequency back-end circuit during operation can be shielded, and electromagnetic interference of the radio frequency back-end circuit to another device around during operation can also be shielded.

According to a second aspect, an embodiment of this application provides a terminal device, including a housing, an antenna, and the circuit board according to the first aspect, where the circuit board is arranged in the housing, and the antenna is electrically connected to a radio frequency back-end circuit of the circuit board.

Technical effects of the terminal device are the same as technical effects of the circuit board in the first aspect, and details are not described herein again.

According to a third aspect, an embodiment of this application provides a method for manufacturing a circuit board, including: providing a substrate, where the substrate is provided with a radio frequency front-end circuit, a radio frequency back-end circuit, and a pad group, where the pad group includes a first pad electrically connected to the radio frequency front-end circuit and a second pad electrically connected to the radio frequency back-end circuit, and the second pad is spaced apart from the first pad; electrically connecting a test end of a radio frequency test instrument to the first pad, to test the radio frequency front-end circuit: and arranging a liquid metal body at a position of the pad group after the testing of the radio frequency front-end circuit is completed, to connect the first pad to the second pad, so as to electrically connect the radio frequency front-end circuit to the radio frequency back-end circuit.

Technical effects of the method for manufacturing a circuit board are the same as technical effects of the circuit board in the first aspect, and details are not described herein again.

In some embodiments, the arranging a liquid metal body at a position of the pad group after the testing of the radio frequency front-end circuit is completed, to connect the first pad to the second pad includes: arranging the liquid metal body on a side that is of the pad group and that is far away from the substrate, to enable the liquid metal body to be in contact with the first pad and the second pad.

By using the foregoing technical solution, the liquid metal body is prevented from being in contact with the substrate, thereby reducing a risk that a line on the substrate is short-circuited by the liquid metal body.

In some embodiments, before the arranging the liquid metal body on a side that is of the pad group and that is far away from the substrate, the method further includes: filling a gap between the first pad and the second pad with an insulating material, to form a first insulation layer.

By using the foregoing technical solution, the first insulation layer can support a part that is of the liquid metal body and that is opposite to a space between the first pad and the second pad, so as to better prevent the liquid metal body from being in contact with the substrate.

In some embodiments, the arranging the liquid metal body on a side that is of the pad group and that is far away from the substrate, to enable the liquid metal body to be in contact with the first pad and the second pad includes: laminating a mask with a mask hole on an upper layer of the substrate, so that the pad group is located in the mask hole; and coating the mask hole with a liquid metal material, to form the liquid metal body on the side that is of the pad group and that is far away from the substrate.

By using the foregoing technical solution, a coating position and a coating amount of the liquid metal material can be accurately controlled.

In some embodiments, the arranging a liquid metal body at a position of the pad group, to connect the first pad to the second pad includes: filling the gap between the first pad and the second pad with a liquid metal material, to form the liquid metal body.

By using the foregoing technical solution, the liquid metal body can be well prevented from being separated from the pad group and moving to another position when the terminal device shakes.

In some embodiments, the filling the gap between the first pad and the second pad with a liquid metal material, to form the liquid metal body includes: laminating a mask with a mask hole on an upper layer of the substrate, so that the pad group is located in the mask hole; and coating the mask hole with a liquid metal material, to form the liquid metal body in the gap between the first pad and the second pad.

By using the foregoing technical solution, a coating position and a coating amount of the liquid metal material can be accurately controlled.

In some embodiments, after the arranging a liquid metal body at a position of the pad group, the method further includes: coating the position of the liquid metal body with an insulating material, to form a second insulation layer covering the liquid metal body.

By using the foregoing technical solution, the liquid metal body can be prevented from being in contact with and short-circuited with an electronic device around the pad group.

In some embodiments, the coating the position of the liquid metal body with an insulating material, to form a second insulation layer covering the liquid metal body includes: coating the position of the liquid metal body with an insulating adhesive material, and then curing to form the second insulation layer.

By using the foregoing technical solution, the second insulation layer formed by curing the insulating adhesive material has a certain mechanical strength, so that the position of the liquid metal body can be well limited at the pad group.

DESCRIPTION OF EMBODIMENTS

In embodiments of this application, the terms "first" and "second" are used for descriptive purposes only, and cannot be construed as indicating or implying relative importance or implicitly indicating the quantity of technical features indicated. Therefore, the features defined with "first" and "second" may explicitly or implicitly include one or more of the features.

In embodiments of this application, it should be noted that the term "electrical connection" should be understood in a broad sense, for example, as a direct connection for current conduction or as a capacitive coupling for electric energy conduction.

Embodiments of this application provide a circuit board and a manufacturing method thereof, and a terminal device, to improve reliability of connection between a radio frequency front-end circuit and a radio frequency back-end circuit by using a liquid metal body instead of serial devices soldered to a pad in a related technology.

The terminal device in the embodiments of this application may be a terminal device with an antenna structure, such as a mobile phone, a tablet computer, an e-reader, a wearable device (such as a smartwatch), a POS (point of sales terminal, point of sales information management system) terminal, a personal digital assistant (personal digital assistant, PDA), a vehicle-mounted device, or an Internet TV.

A circuit board of the terminal device in the embodiments of this application is described below in detail by using a mobile phone as an example. Another type of terminal device may be specifically arranged with reference to a design concept of a circuit board in the mobile phone embodiments, and details are not described herein again.

Figure 1:
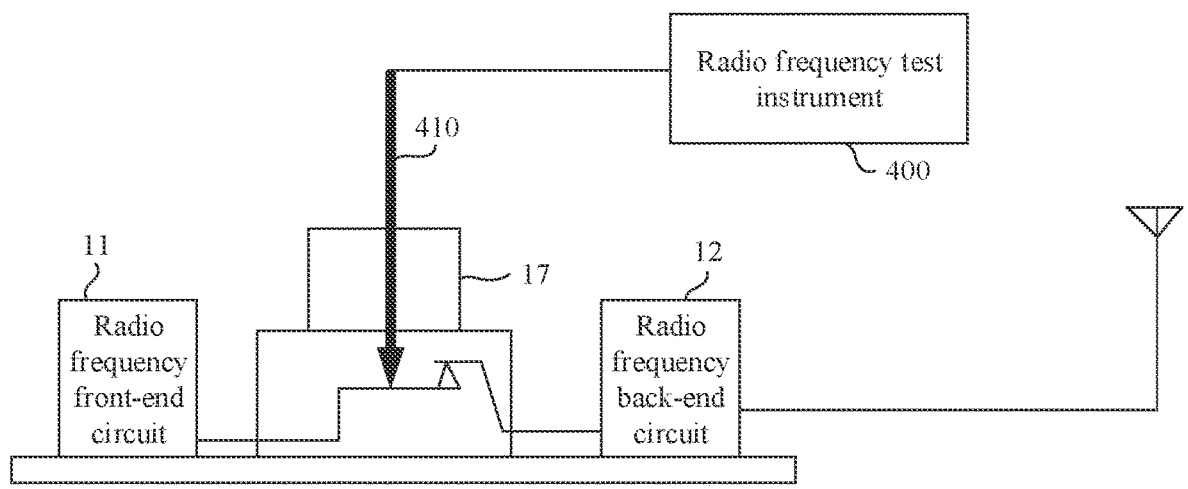
FIG. 1 is a schematic diagram showing testing of a circuit board of a current terminal device.
Figure 2:
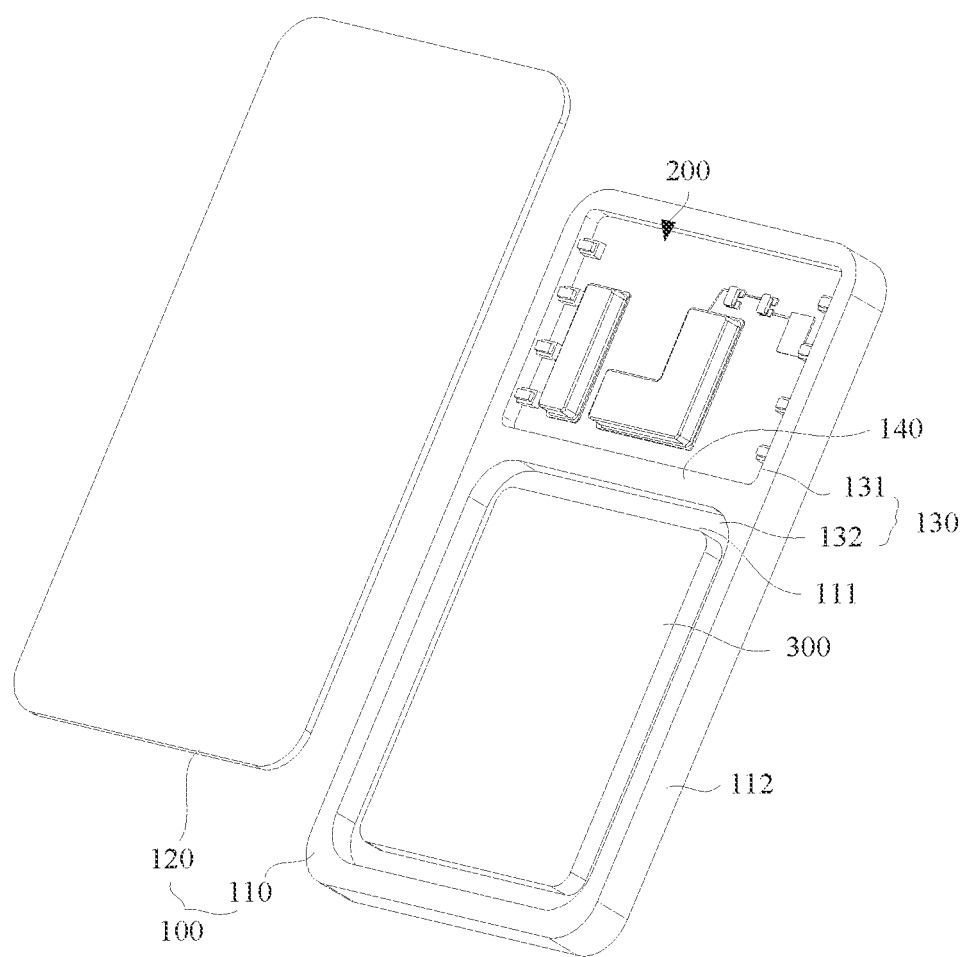
FIG. 2 is an exploded view of a mobile phone in some embodiments of this application.

FIG. 2 is an exploded view of a mobile phone in some embodiments of this application. The mobile phone includes a housing 100, a circuit board 200, and a battery 300. The housing 100 includes a front housing 110 (also referred to as a middle frame) and a rear cover 120 (also referred to as a battery cover). The front housing 110 includes a bottom wall 111 and a side wall 112 arranged on an edge of the bottom wall 111. The rear cover 120 is buckled on the front housing 110, and the rear cover 120 forms an accommodating space 130 with the bottom wall 111 and the side wall 112 of the front housing 110. The accommodating space 130 includes a circuit board accommodating space 131 and a battery accommodating space 132 separated by a partition wall 140. The circuit board 200 is arranged in the circuit board accommodating space 131, and the battery 300 is arranged in the battery accommodating space 132 and is electrically connected to the circuit board 200 by using an electrical connector (not shown in the figure).

Figure 3:
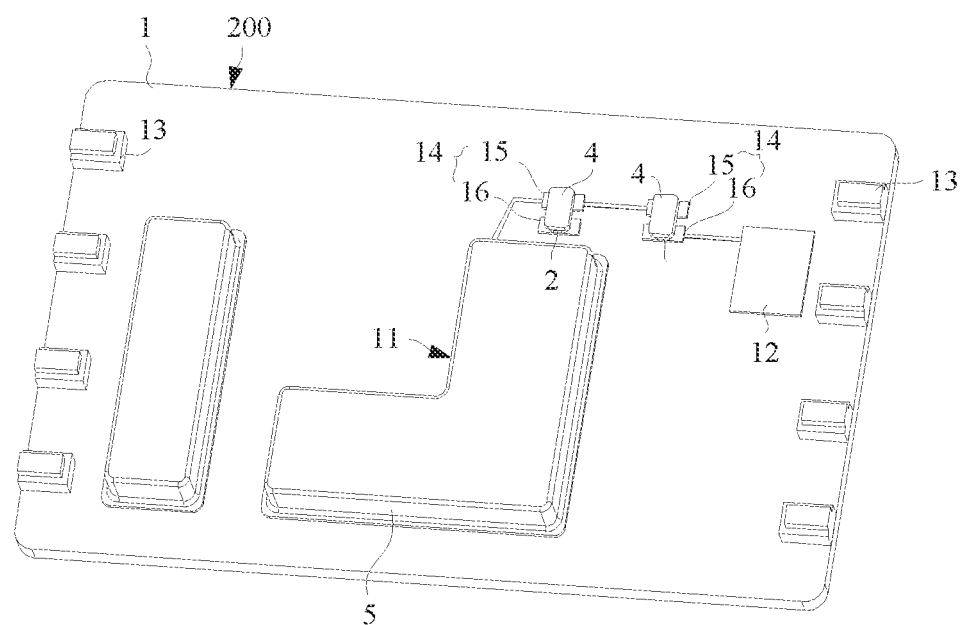
FIG. 3 is a schematic diagram of a structure of a circuit board in FIG. 2.
Figure 4:
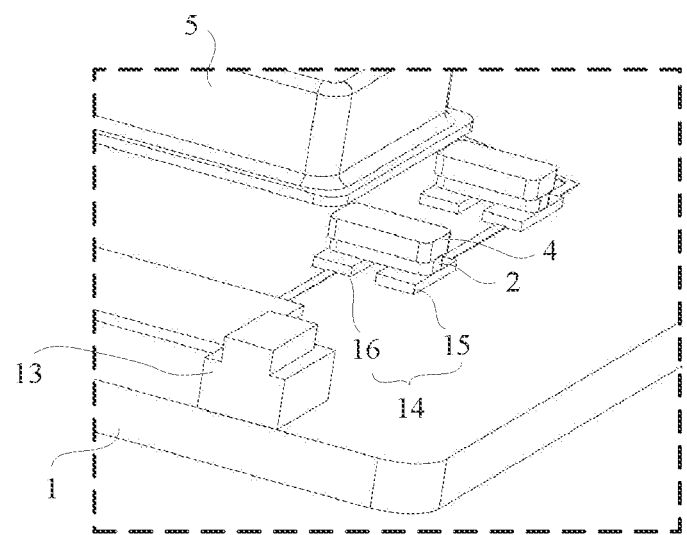
FIG. 4 is a partial schematic diagram of FIG. 3.
Figure 5:
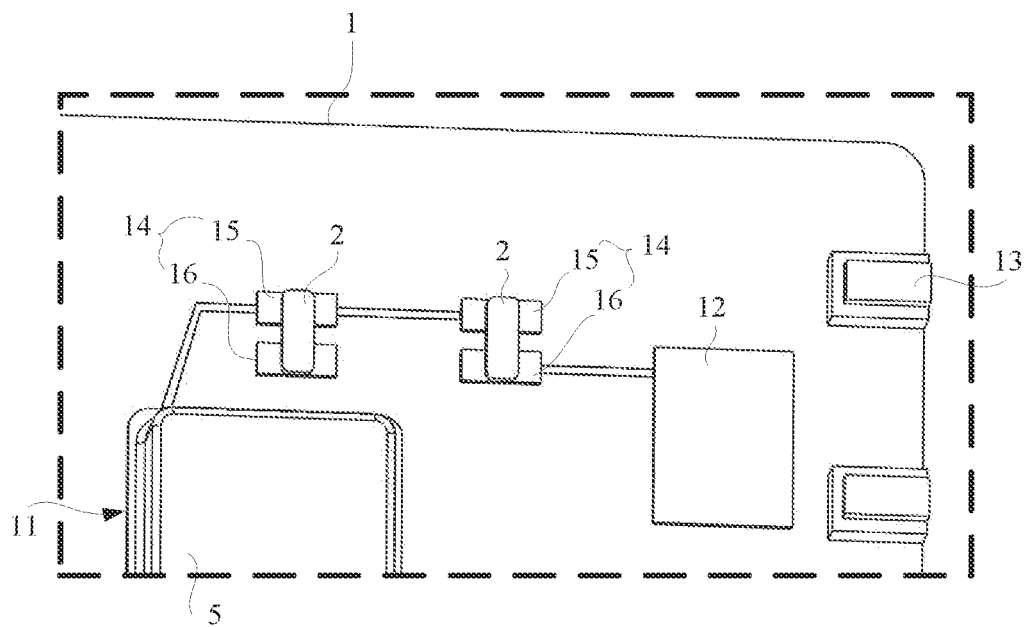
FIG. 5 is a schematic diagram of a structure of the circuit board in FIG. 3 after removal of a second insulation layer.

FIG. 3 is a schematic diagram of a structure of a circuit board 200 in FIG. 2; FIG. 4 is a partial schematic diagram of FIG. 3, and FIG. 5 is a schematic diagram of a structure of the circuit board 200 in FIG. 3 after removal of a second insulation layer 4. The circuit board 200 includes a substrate 1 and a liquid metal body 2.

The substrate 1 is provided with a radio frequency front-end circuit 11, a radio frequency back-end circuit 12, an antenna spring 13, and a pad group 14, where the pad group 14 includes a first pad 15 electrically connected to the radio frequency front-end circuit 11 and a second pad 16 electrically connected to the radio frequency back-end circuit 12, and the second pad 16 is spaced apart from the first pad 15.

Contour shapes of the first pad 15 and the second pad 16 are rectangular (as shown in FIG. 5), but are not limited thereto, and contour shapes of the first pad 15 and the second pad 16 may alternatively be circular, elliptical, or the like.

The terminal device further includes an antenna. The antenna includes an antenna radiator arranged in the circuit board accommodating space 131, and the antenna radiator is electrically connected to the radio frequency back-end circuit 12 by using the antenna spring 13. A quantity of antenna springs 13 may be one or more, specifically depending on a quantity of antenna radiators.

The foregoing substrate 1 is a circuit board 200 without any circuit device or chip soldered. The radio frequency front-end circuit 11 refers to a part of a circuit between the antenna and an intermediate frequency (or baseband) circuit, and in this part of the circuit, a signal is transmitted in the form of a radio frequency. The radio frequency front-end circuit 11 usually includes an amplifier, a filter, a frequency converter, and the like. The radio frequency back-end circuit 12 includes, but is not limited to, an antenna matching circuit.

The liquid metal body 2 is arranged at a position of the pad group 14 and connects the first pad 15 to the second pad 16, so as to electrically connect the radio frequency front-end circuit 11 to the radio frequency back-end circuit 12.

A material of the liquid metal body 2 is a liquid metal material, which is a general name of a kind of metal materials that are in a liquid state at a low temperature. The liquid metal material not only has extremely strong thermal conductivity and electrical conductivity of metal materials, but also has certain fluidity. For example, the liquid metal material may be made into paste, which is sticky in texture and has strong adsorbability.

The material of the liquid metal body may be a low-melting-point metal, such as gallium (Ga) as well as sodium (Na), potassium (K), and lithium (Li) among alkali metals, or may be a low-melting-point alloy, such as a gallium metal alloy, which is not specifically limited herein.

Table 1 shows electrical parameters when the liquid metal body is a gallium metal alloy. According to data in Table 1, it can be learned that electrical conductivity and impedance of the liquid metal body 2 can fully meet a use requirement for a radio frequency circuit.

TABLE 1

| Electrical parameters when the liquid metal body 2 is a gallium metal alloy | | |
|---|---|---|
| Physical item | Unit | Numerical value |
| ρ | Ω · mm$^2$/m | 0.363 |
| I | m | 0.00115 |
| S | mm$^2$ | 0.083 |
| R | Ω | 0.05 |

In Table 1: $R=\rho I/S$, where $\rho$ is a resistivity of the liquid metal body 2; I is a length of the liquid metal body 2: S is a cross-sectional area of the liquid metal body 2; and R is impedance of the liquid metal body 2.

In the foregoing circuit board 200, the liquid metal body 2 is arranged at the position of the pad group 14, and the first pad 15 is connected to the second pad 16. In this way, the connection can be completed by arranging the liquid metal body 2 at the first pad 15 and the second pad 16, a process for the connection between the first pad 15 and the second pad 16 is simpler, and low-temperature solder paste is not needed for soldering, so that a soldering defect caused by mixing up solder paste is prevented, thereby improving reliability of the connection between the first pad 15 and the second pad 16, and improving reliability of the connection between the radio frequency front-end circuit 11 and the radio frequency back-end circuit 12.

In addition, during manufacturing of the circuit board 200, the liquid metal material can be applied onto the pad group 14 by using an existing dot coating device to form the liquid metal body 2, without an additional device, so that a process route of the circuit board 200 is simpler, which reduces manufacturing costs of the circuit board 200.

Figure 6:
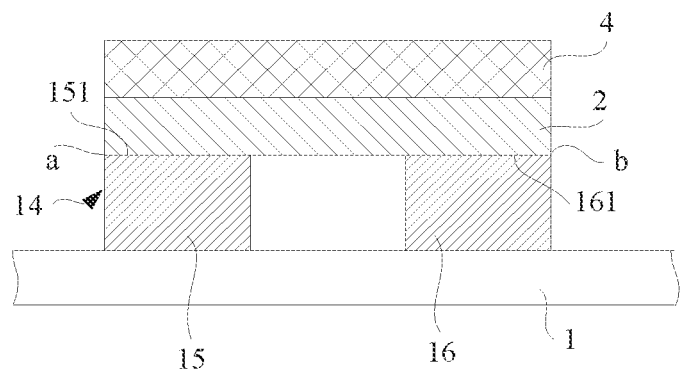
FIG. 6 is a sectional view of the circuit board in FIG. 4 at a pad group.

A position of the liquid metal body 2 at the pad group 14 is not unique. FIG. 5 and FIG. 6 show a first embodiment of a position of the liquid metal body 2 at the pad group 14, and FIG. 6 shows a sectional view of the circuit board 200 in FIG. 4 at the pad group 14. In this embodiment, the liquid metal body 2 is arranged on a side that is of the pad group 14 and that is far away from the substrate 1, and is in contact with the first pad 15 and the second pad 16.

The arrangement of the liquid metal body 2 on a side that is of the pad group 14 and that is far away from the substrate 1 can make the liquid metal body 2 spaced apart from the substrate 1 by a distance, so that the liquid metal body 2 is prevented from being in contact with the substrate 1, thereby reducing a risk that a line on the substrate 1 is short-circuited by the liquid metal body 2.

It should be noted that the surface of the liquid metal body 2 has certain tension, which can span a gap between the first pad 15 and the second pad 16.

In some embodiments, as shown in FIG. 5 and FIG. 6, the first pad 15 includes a first pad surface 151 on a side far away from the substrate 1, and the second pad 16 includes a second pad surface 161 on a side far away from the substrate 1. The liquid metal body 2 has a layered structure, and is laminated with the first pad surface 151 and the first pad surface 151. By arranging the liquid metal body 2 into the layered structure, when the volume of the liquid metal body 2 is constant, a contact area between the liquid metal body 2 and the first pad surface 151 and a contact area between the liquid metal body 2 and the second pad surface 161 can be increased, thereby reducing impedance of the liquid metal body 2, and facilitating transmission of a radio frequency signal on the liquid metal body 2.

Certainly, based on an actual situation, the liquid metal body 2 may alternatively be set to be in another shape, such as a water drop shape or a conical shape.

In some embodiments, as shown in FIG. 5 and FIG. 6, the liquid metal body 2 is flush with a side edge (a side edge a of the first pad surface 151 shown in FIG. 6) that is of the first pad surface 151 and that is far away from the second pad 16. In this way, the contact area between the liquid metal body 2 and the first pad surface 151 can be maximized, thereby better reducing impedance of the liquid metal body 2, and facilitating transmission of a radio frequency signal on the liquid metal body 2.

In some embodiments, as shown in FIG. 5 and FIG. 6, the liquid metal body 2 is flush with a side edge (a side edge b of the second pad surface 161 shown in FIG. 6) that is of the second pad surface 161 and that is far away from the first pad 15. In this way, the contact area between the liquid metal body 2 and the second pad surface 161 can be maximized, thereby better reducing impedance of the liquid metal body 2, and facilitating transmission of a radio frequency signal on the liquid metal body 2.

The liquid metal body 2 may be flush with the side edge a of the first pad surface 151 and the side edge b of the second pad surface 161, or may be flush with only the side edge a of the first pad surface 151 or the side edge b of the second pad surface 161, specifically depending on an actual situation.

In some embodiments, as shown in FIG. 5 and FIG. 6, the first pad surface 151 is flush with the second pad surface 161. In this way, the first pad 15 and the second pad 16 can be prevented from forming a step, so that the liquid metal body 2 can be easily arranged on the first pad surface 151 and the second pad surface 161.

Figure 7:
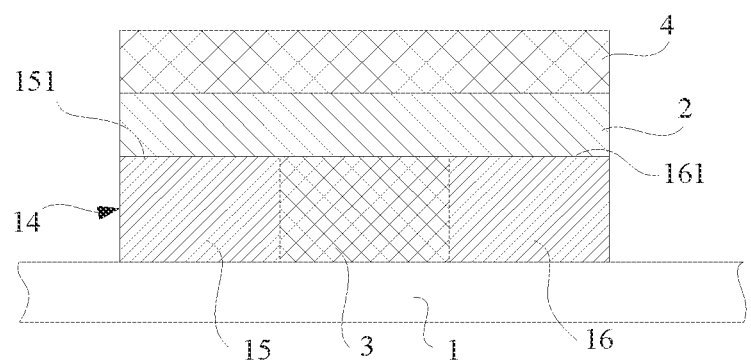
FIG. 7 is a diagram of a structure of a circuit board according to some other embodiments of this application at a pad group.

In some embodiments, FIG. 7 is a diagram of a structure of a circuit board 200 according to some other embodiments of this application at a pad group 14. The circuit board 200 further includes a first insulation layer 3, and the first insulation layer 3 fills a gap between the first pad 15 and the second pad 16. In this way, the first insulation layer 3 can support a part that is of the liquid metal body 2 and that is opposite to the gap between the first pad 15 and the second pad 16, so as to better prevent the liquid metal body 2 from being in contact with the substrate 1, thereby greatly reducing a risk that a line on the substrate 1 is short-circuited by the liquid metal body 2.

For example, the first insulation layer 3 may be an insulating adhesive layer, and the insulating adhesive layer may be formed by curing a thermosetting adhesive or an ultraviolet curing adhesive.

In some embodiments, in FIG. 4 and FIG. 6, the circuit board 200 further includes a second insulation layer 4, and the second insulation layer 4 is arranged at a position of the liquid metal body 2 to cover the liquid metal body 2.

The liquid metal body 2 is covered with the second insulation layer 4, so that the second insulation layer 4 can isolate the liquid metal body 2, thereby preventing the liquid metal body 2 from being in contact and short-circuited with an electronic device around the pad group 14.

In some embodiments, the second insulation layer 4 is a thermosetting adhesive layer, and the thermosetting adhesive layer is formed by heating and curing a thermosetting adhesive, and has a certain mechanical strength. Covering the liquid metal body 2 with the thermosetting adhesive layer can not only achieve an insulating effect, but also well limit the position of the liquid metal body 2 at the pad group 14, so as to prevent the liquid metal body 2 from being separated from the pad group 14 and moving to another position when a terminal device shakes.

For example, the thermosetting adhesive layer is a UF (Underfill; underfill) adhesive layer, and a main component of a UF adhesive is an epoxy resin.

In some embodiments, the second insulation layer 4 is an ultraviolet curing adhesive layer, and the ultraviolet curing adhesive layer is an adhesive layer formed by curing an ultraviolet curing adhesive (alias: photosensitive adhesive, or shadowless adhesive) through ultraviolet irradiation, also has a certain mechanical strength, and can not only achieve an insulating effect, but also well limit the position of the liquid metal body 2 at the pad group 14.

In some embodiments, as shown in FIG. 6, the liquid metal body 2 has a layered structure, and the second insulation layer 4 is stacked on a side that is of the liquid metal body 2 and that is far away from the substrate 1.

The liquid metal body 2 is arranged into the layered structure, and the second insulation layer 4 is stacked on the side that is of the liquid metal body 2 and that is far away from the substrate 1. In this way, the second insulation layer 4 can be easily arranged on the liquid metal body 2, so that a contact area between the second insulation layer 4 and the liquid metal body 2 is large, and the second insulation layer 4 will not be easily separated from the liquid metal body 2.

Figure 8:
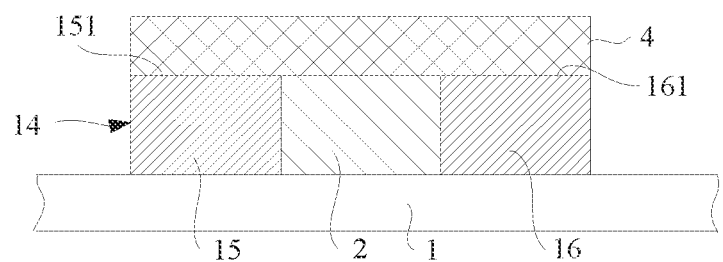
FIG. 8 is a diagram of a structure of a circuit board according to some other embodiments of this application at a pad group.

FIG. 8 shows a second embodiment of a position of the liquid metal body 2 at the pad group 14. In this embodiment, the liquid metal body 2 fills the gap between the first pad 15 and the second pad 16.

The liquid metal body 2 fills the gap between the first pad 15 and the second pad 16, so that the first pad 15 and the second pad 16 can limit the position of the liquid metal body 2, which can better prevent the liquid metal body 2 from being separated from the pad group 14 and moving to another position when a terminal device shakes.

In some embodiments, as shown in FIG. 8, the second insulation layer 4 is stacked on a side that is of the liquid metal body 2 and that is far away from the substrate 1. In this way, the second insulation layer 4, the first pad 15, and the second pad 16 wrap the liquid metal body 2, so that the position of the liquid metal body 2 can be better limited, thereby better preventing the liquid metal body 2 from being separated from the pad group 14 and moving to another position when a terminal device shakes.

In some embodiments, as shown in FIG. 8, the second insulation layer 4 covers the first pad surface 151 and the second pad surface 161. In this way, the second insulation layer 4 can protect the first pad 15 and the second pad 16, so as to prevent transmission of radio frequency signals between the first pad 15 and the second pad 16 from being affected when another conductive device is in contact with the first pad surface 151 and the second pad surface 161.

A specific type of the second insulation layer 4 in this embodiment may be set with reference to the type setting of the second insulation layer 4 in the embodiments shown in FIG. 4 and FIG. 6. Details are not described herein again.

In some embodiments, as shown in FIG. 5, a plurality of pad groups 14 are provided, and the plurality of pad groups 14 are arranged side by side. The first pad 15 in each pad group 14 is electrically connected to the radio frequency front-end circuit 11, and the second pad 16 in each pad group 14 is electrically connected to the radio frequency back-end circuit 12. The first pad 15 in each pad group 14 is connected to the second pad 16 by using the liquid metal body 2.

By arranging a plurality of pad groups 14 side by side, when the radio frequency front-end circuit 11 is tested, a test end 410 of a radio frequency test instrument 400 can be connected to the first pads 15 of the plurality of pad groups 14, thereby improving reliability of connection between the test end 410 and the pad groups 14. The plurality of pad groups 14 are arranged side by side, so that the test end 410 of the radio frequency test instrument 400 can be easily connected to the first pads 15 of the plurality of pad groups 14.

In some embodiments, as shown in FIG. 3, the circuit board 200 further includes a first shielding can 5, and the first shielding can 5 covers a region of the substrate 1 provided with the radio frequency front-end circuit 11. In this way, the first shielding can 5 can not only shield electromagnetic interference of another device on the substrate 1 to the radio frequency front-end circuit 11 during operation, but also shield electromagnetic interference of the radio frequency front-end circuit 11 to another device around during operation.

In some embodiments, the circuit board 200 further includes a second shielding can, and the second shielding can covers a region of the substrate 1 provided with the radio frequency back-end circuit 12. In this way, the second shielding can can not only shield electromagnetic interference of another device on the substrate 1 to the radio frequency back-end circuit 12 during operation, but also shield electromagnetic interference of the radio frequency back-end circuit 12 to another device around during operation.

Figure 9A:
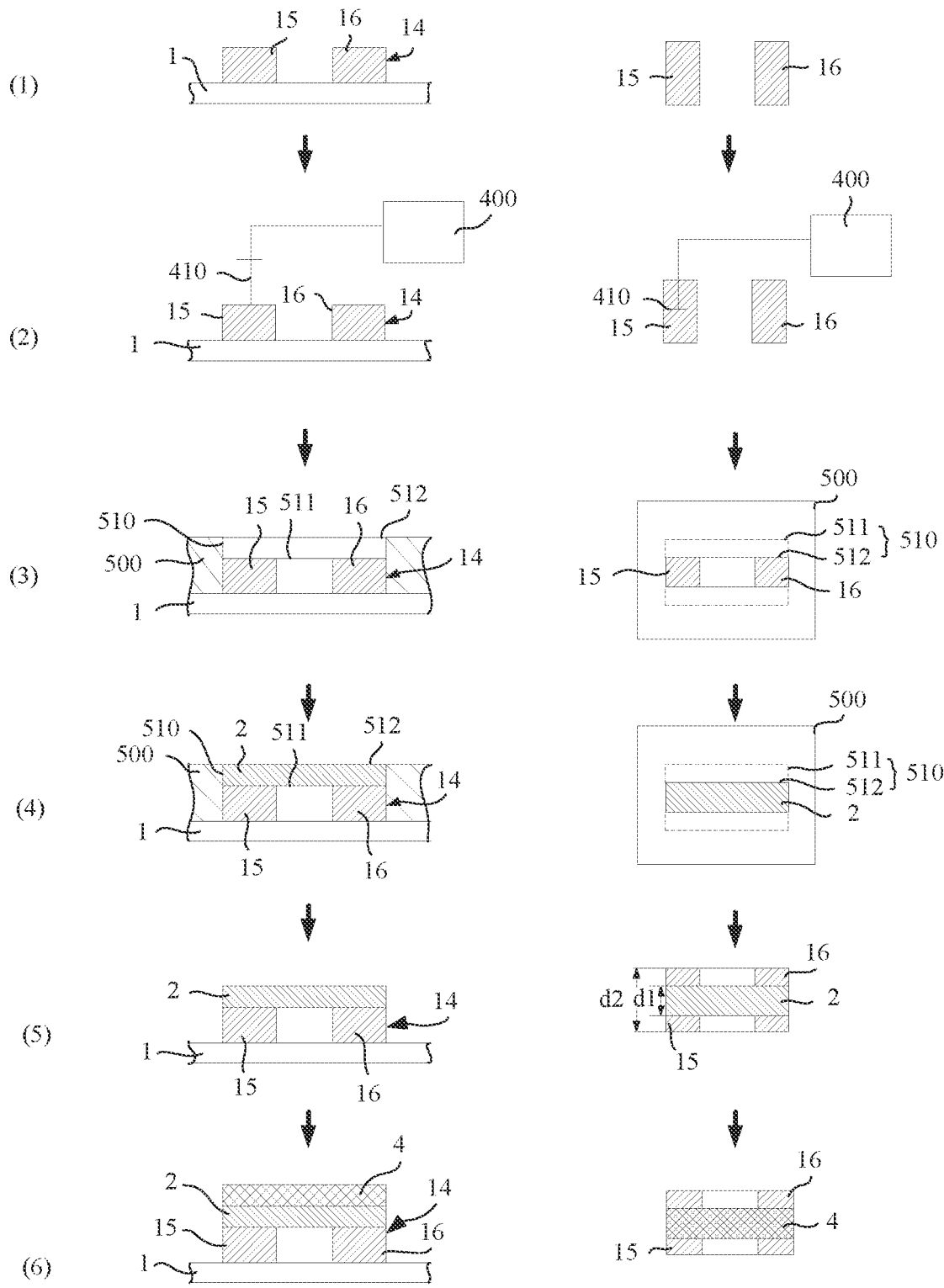
FIG. 9a is a process diagram of a method for manufacturing the circuit board shown in FIG. 6.
Figure 9B:
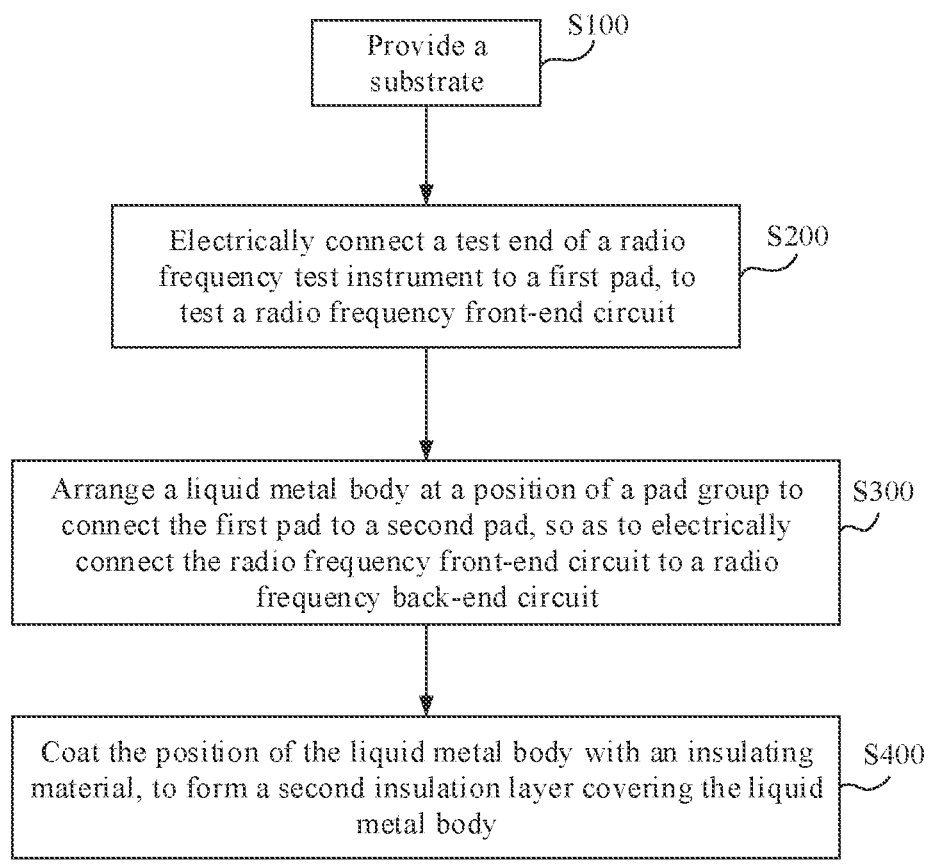
FIG. 9b is a flowchart of a method for manufacturing the circuit board shown in FIG. 6.

FIG. 9a is a process diagram of a method for manufacturing the circuit board 200 shown in FIG. 6, and a diagram on the right side in FIG. 9a is a top view of the diagram on the left side; and FIG. 9b is a flowchart of a method for manufacturing the circuit board 200 shown in FIG. 6. The method for manufacturing the circuit board 200 includes the following steps.

S100: As shown in (1) in FIG. 9a, provide a substrate 1.

The substrate 1 is provided with a radio frequency front-end circuit 11, a radio frequency back-end circuit 12, and a pad group 14, where the pad group 14 includes a first pad 15 electrically connected to the radio frequency front-end circuit 11 and a second pad 16 electrically connected to the radio frequency back-end circuit 12, and the second pad 16 is spaced apart from the first pad 15.

S200: As shown in (2) in FIG. 9a, electrically connect a test end 410 of a radio frequency test instrument 400 to the first pad 15, to test the radio frequency front-end circuit 11.

The test end 410 of the radio frequency test instrument 400 may be a test probe, and the test probe can be inserted into the first pad 15 to implement electrical connection to the first pad 15. During testing, the radio frequency test instrument 400 sends a test signal to the first pad 15 by using the test end 410, to test the radio frequency front-end circuit 11. After the testing is completed, the test end 410 needs to be removed from the first pad 15 to disconnect from the first pad 15.

S300: As shown in (3)-(5) in FIG. 9a, arrange a liquid metal body 2 is at a position of the pad group 14 to connect the first pad 15 to the second pad 16, so as to electrically connect the radio frequency front-end circuit 11 to the radio frequency back-end circuit 12. A dot coating device can extrude and apply a liquid metal material at the pad group 14 by using a needle tube, to form the liquid metal body 2.

S400: As shown in (6) in FIG. 9a, coat the position of the liquid metal body 2 with an insulating material, to form a second insulation layer 4 covering the liquid metal body 2.

The liquid metal body 2 can be isolated by arranging the second insulation layer 4, thereby preventing the liquid metal body 2 from being in contact and short-circuited with an electronic device around the pad group 14. Certainly, the second insulation layer 4 may not be provided if the electronic device around the pad group 14 can be prevented from being in contact with the liquid metal body 2.

In some embodiments, as shown in (5) in FIG. 9a, step S300 includes the following steps.

S310: Arrange the liquid metal body 2 on a side that is of the pad group 14 and that is far away from the substrate 1, to enable the liquid metal body 2 to be in contact with the first pad 15 and the second pad 16.

In this way, the liquid metal body 2 can be spaced apart from the substrate 1 by a distance, so that the liquid metal body 2 is prevented from being in contact with the substrate 1, thereby reducing a risk that a line on the substrate 1 is short-circuited by the liquid metal body 2.

In some embodiments, step S310 includes the following steps.

S311: As shown in (3) in FIG. 9a, laminate a mask 500 with a mask hole 510 on an upper layer of the substrate 1, so that the pad group 14 is located in the mask hole 510. The mask 500 may be made of an insulating material, such as plastic.

S312; As shown in (4) in FIG. 9a, coat the mask hole 510 with a liquid metal material, to form the liquid metal body 2 on the side that is of the pad group 14 and that is far away from the substrate 1.

When the liquid metal body 2 covers a part of the first pad surface 151 and a part of the second pad surface 161, for example, when a width d1 of the liquid metal body 2 is less than a size d2 of the first pad 15, as shown in (3) and (4) in FIG. 9a, the mask hole 510 needs to be made into a step shape. The mask hole 510 includes a large hole section 511 and a small hole section 512, and a size of the large hole section 511 matches a size of a region where the pad group 14 is located. The first pad 15 and the second pad 16 are located in the large hole section 511. A hole wall of the small hole section 512, the first pad surface 151, and the second pad surface 161 form a "container". The formed liquid metal body 2 can cover a part of the first pad surface 151 and a part of the second pad surface 161 by coating the inside of the "container" with the liquid metal material.

When the liquid metal body 2 completely covers the first pad surface 151 and the second pad surface 161, for example, when the width d1 of the liquid metal body 2 is equal to the size d2 of the first pad 15, the mask hole 510 needs to be made into a straight hole shape. After the mask hole 510 is coated with the liquid metal material, the formed liquid metal body 2 can completely cover the first pad surface 151 and the second pad surface 161.

When the mask hole 510 is coated with the liquid metal material, if a part of the liquid metal material overflows the mask hole 510, the part of the liquid metal material may be scraped off.

In this embodiment, the liquid metal body 2 is manufactured by arranging the mask 500, so that a coating position and a coating amount of the liquid metal material can be accurately controlled, thereby ensuring that the liquid metal body 2 can accurately connect the first pad 15 to the second pad 16.

In some embodiments, step S400 includes:

coating the position of the liquid metal body 2 with an insulating adhesive material, and then curing to form the second insulation layer 4. When the liquid metal body 2 has a layered structure, the insulating adhesive material may be applied to a side that is of the liquid metal body 2 and that is far away from the substrate 1, to form the second insulation layer 4.

The second insulation layer 4 formed by curing the insulating adhesive material has a certain mechanical strength, and can well limit the position of the liquid metal body 2 at the pad group 14, so as to prevent the liquid metal body 2 from being separated from the pad group 14 and moving to another position when a terminal device shakes.

The foregoing insulating adhesive material may be a thermosetting adhesive or an ultraviolet curing adhesive.

Figure 10:
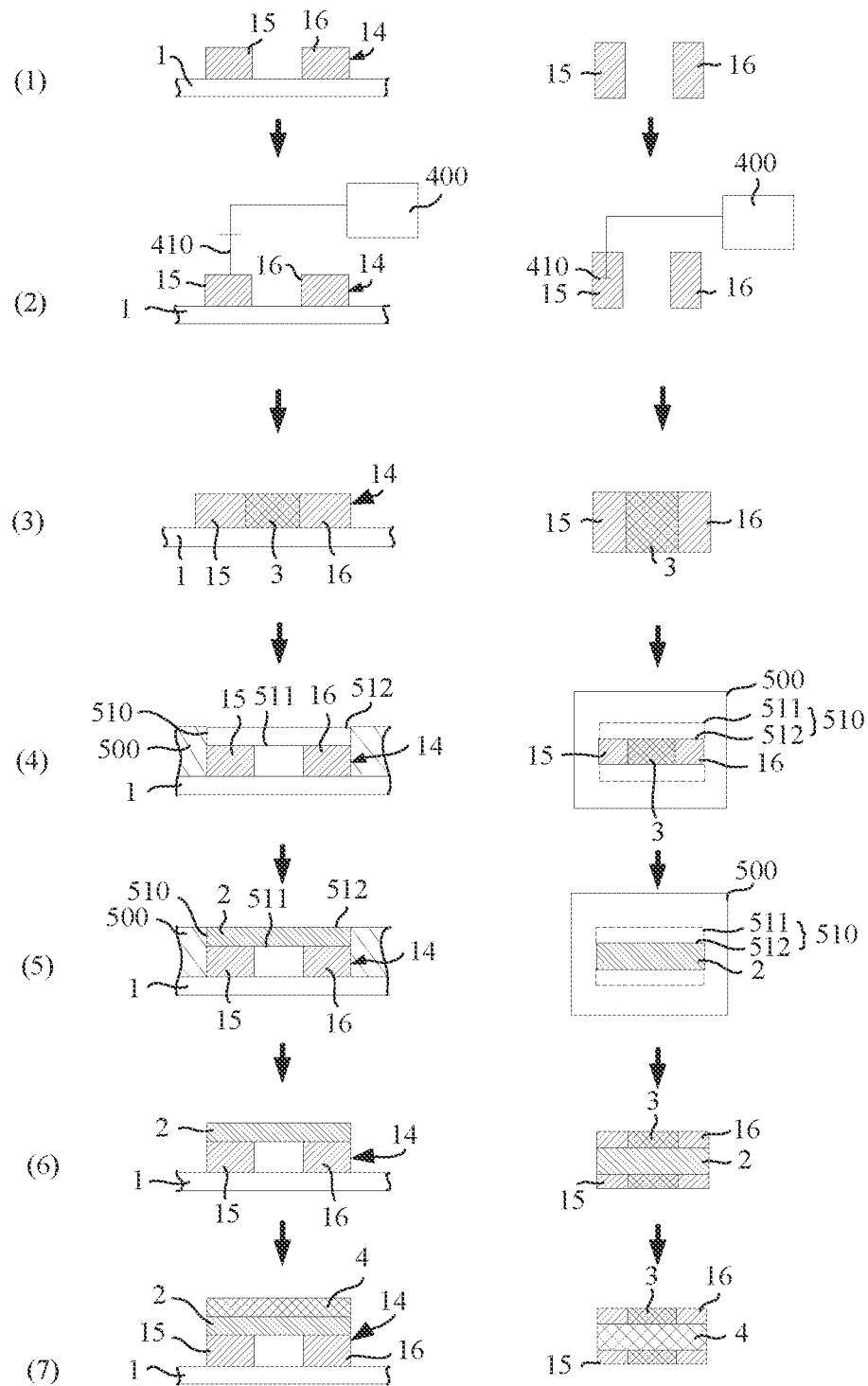
FIG. 10 is a process diagram of a method for manufacturing the circuit board shown in FIG. 7.

FIG. 10 is a process diagram of a method for manufacturing the circuit board 200 shown in FIG. 7. The method for manufacturing the circuit board 200 shown in FIG. 10 differs from the method for manufacturing the circuit board 200 shown in FIG. 9a in that in the method for manufacturing the circuit board 200 shown in FIG. 10, before step S300, an insulating material fills a gap between a first pad 15 and a second pad 16, to form a first insulation layer 3.

The method for manufacturing the circuit board 200 includes the following steps.

S100: As shown in (1) in FIG. 10, provide a substrate 1.

S200: As shown in (2) in FIG. 10, electrically connect a test end 410 of a radio frequency test instrument 400 to the first pad 15, to test a radio frequency front-end circuit 11.

S250: As shown in (3) in FIG. 10, fill a gap between the first pad 15 and the second pad 16 with an insulating material, to form a first insulation layer 3.

In this way, the first insulation layer 3 can support a part that is of the liquid metal body 2 and that is opposite to a space between the first pad 15 and the second pad 16, so as to better prevent the liquid metal body 2 from being in contact with the substrate 1, thereby greatly reducing a risk that a line on the substrate 1 is short-circuited by the liquid metal body 2.

S300: As shown in (4)-(6) in FIG. 10, arrange a liquid metal body 2 is at a position of the pad group 14 to connect the first pad 15 to the second pad 16, so as to electrically connect the radio frequency front-end circuit 11 to a radio frequency back-end circuit 12.

S400: As shown in (7) in FIG. 10, coat the position of the liquid metal body 2 with an insulating material, to form a second insulation layer 4 covering the liquid metal body 2.

The liquid metal body 2 can be isolated by arranging the second insulation layer 4, thereby preventing the liquid metal body 2 from being in contact and short-circuited with an electronic device around the pad group 14. Certainly, the second insulation layer 4 may not be provided if the electronic device around the pad group 14 can be prevented from being in contact with the liquid metal body 2.

In this embodiment, specific steps in step S300 and step S400 may be set with reference to the description in FIG. 9a. Details are not described herein again.

Figure 11A:
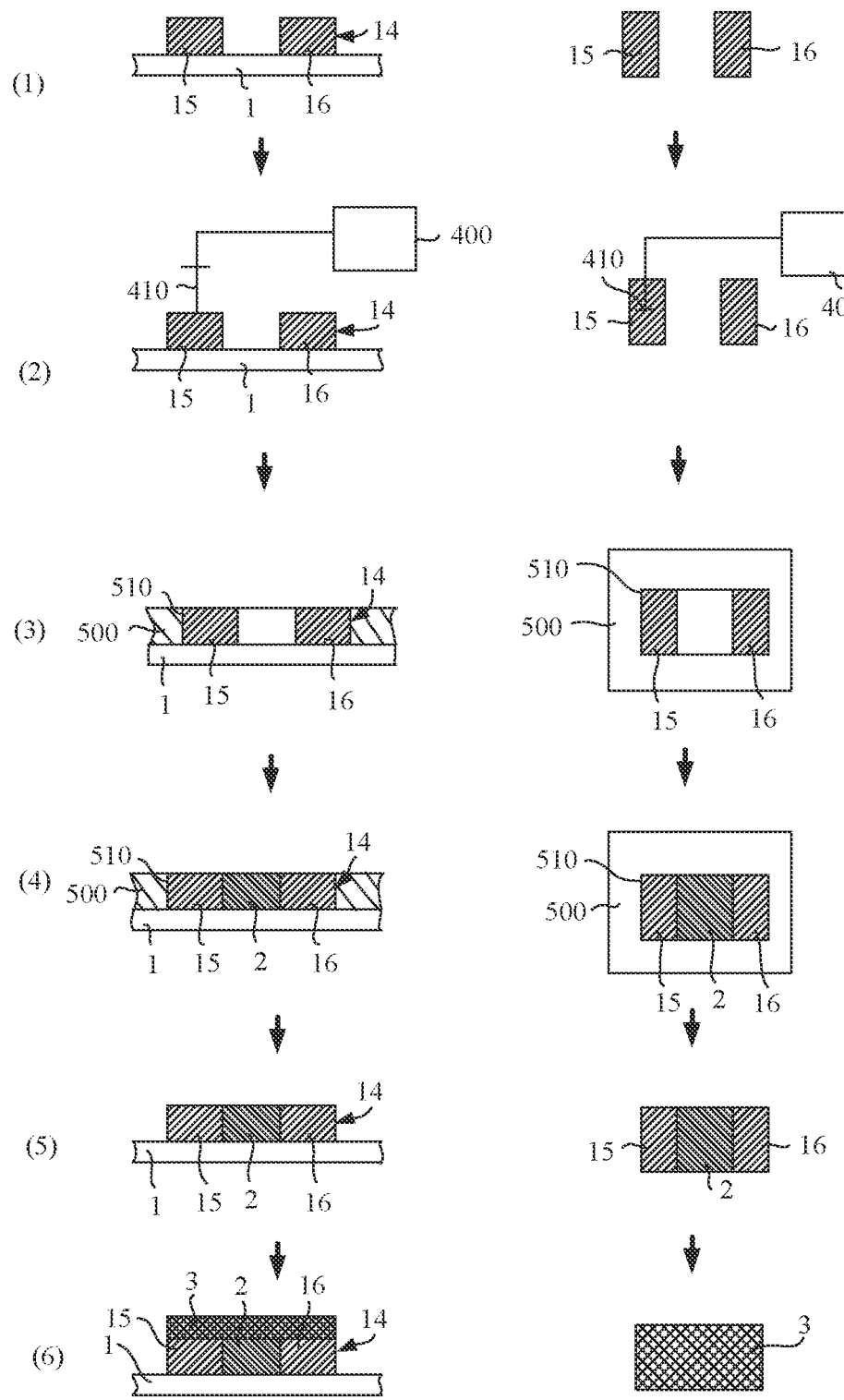
FIG. 11a is a process diagram of a method for manufacturing the circuit board shown in FIG. 8.
Figure 11B:
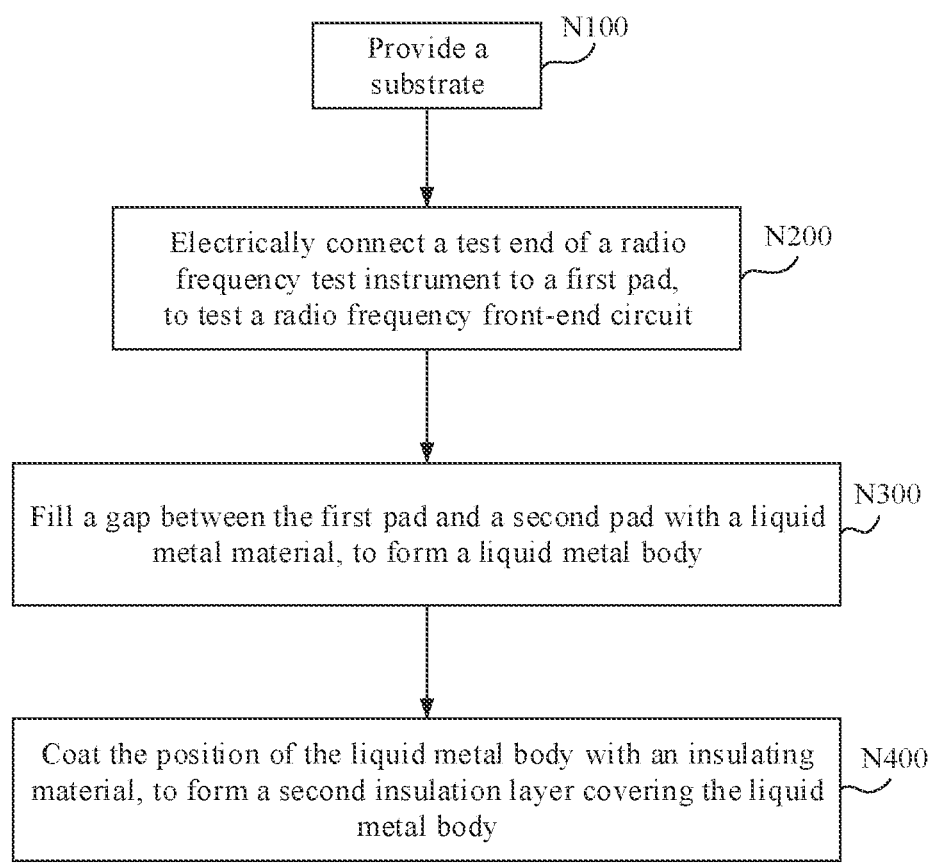
FIG. 11b is a flowchart of a method for manufacturing the circuit board shown in FIG. 8.

FIG. 11a is a process diagram of a method for manufacturing the circuit board 200 shown in FIG. 8, and a diagram on the right side in FIG. 11a is a top view of the diagram on the left side; and FIG. 11b is a flowchart of a method for manufacturing the circuit board 200 shown in FIG. 8. The method for manufacturing the circuit board 200 includes the following steps.

N100: As shown in (1) in FIG. 11a, provide a substrate 1.

The substrate 1 is provided with a radio frequency front-end circuit 11, a radio frequency back-end circuit 12, and a pad group 14, where the pad group 14 includes a first pad 15 electrically connected to the radio frequency front-end circuit 11 and a second pad 16 electrically connected to the radio frequency back-end circuit 12, and the second pad 16 is spaced apart from the first pad 15.

N200. As shown in (2) in FIG. 11a, electrically connect a test end 410 of a radio frequency test instrument 400 to the first pad 15, to test the radio frequency front-end circuit 11.

The test end 410 of the radio frequency test instrument 400 may be a test probe, and the test probe can be inserted into the first pad 15 to implement electrical connection to the first pad 15. During testing, the radio frequency test instrument 400 sends a test signal to the first pad 15 by using the test end 410, to test the radio frequency front-end circuit 11. After the testing is completed, the test end 410 needs to be removed from the first pad 15 to disconnect from the first pad 15.

N300: As shown in (3)-(5) in FIG. 11a, fill a gap between the first pad 15 and the second pad 16 with a liquid metal material, to form a liquid metal body 2. The liquid metal material can be extruded and applied to the gap between the first pad 15 and the second pad 16 through a needle tube of a dot coating device, to form the liquid metal body 2.

N400: As shown in (4) in FIG. 11a, coat the position of the liquid metal body 2 with an insulating material, to form a second insulation layer 4 covering the liquid metal body 2.

Specifically, the insulating material is applied to a side that is of the liquid metal body 2 and that is far away from the substrate 1, to form the second insulation layer 4.

The liquid metal body 2 can be isolated by arranging the second insulation layer 4, thereby preventing the liquid metal body 2 from being in contact and short-circuited with an electronic device around the pad group 14. Certainly, the second insulation layer 4 may not be provided if the electronic device around the pad group 14 can be prevented from being in contact with the liquid metal body 2.

In some embodiments, step N300 includes the following steps.

N310: As shown in (3) in FIG. 11a, laminate a mask 500 with a mask hole 510 on an upper layer of the substrate 1, so that the pad group 14 is located in the mask hole 510. The mask 500 may be made of an insulating material, such as plastic.

N320: As shown in (4) and (5) in FIG. 11a, coat the mask hole 510 with a liquid metal material, to form a liquid metal body 2 in the gap between the first pad 15 and the second pad 16.

A size of the mask hole 510 may match a size of a region where the pad group 14 is located, so that a hole wall of the mask hole 510 can achieve a blocking effect to prevent the liquid metal material from overflowing from two ends of the gap between the first pad 15 and the second pad 16. When the mask hole 510 is coated with the liquid metal material, if a part of the liquid metal material overflows the mask hole 510, the part of the liquid metal material may be scraped off.

In this embodiment, the liquid metal body 2 is manufactured by arranging the mask 500, so that a coating position and a coating amount of the liquid metal material can be accurately controlled, thereby ensuring that the liquid metal body 2 is located in the gap between the first pad 15 and the second pad 16 to connect the first pad 15 to the second pad 16.

In some embodiments, step N400 includes: coating the position of the liquid metal body 2 with an insulating adhesive material, and then curing to form the second insulation layer 4. Specifically, the insulating adhesive material is applied to a side that is of the liquid metal body 2 and that is far away from the substrate 1, to form the second insulation layer 4.

The second insulation layer 4 formed by curing the insulating adhesive material has a certain mechanical strength, and can well limit the position of the liquid metal body 2 at the pad group 14, so as to prevent the liquid metal body 2 from being separated from the pad group 14 and moving to another position when a terminal device shakes.

The foregoing insulating adhesive material may be a thermosetting adhesive or an ultraviolet curing adhesive.

In the description of the specification, specific features, structures, materials or characteristics may be combined in any suitable manner in one or more embodiments or examples.

Finally, it should be noted that the foregoing embodiments are only used to illustrate the technical solutions of this application, but are not used to limit this application. Although this application has been described in detail with reference to the foregoing embodiments, it should be understood by a person of ordinary skill in the art that the technical solutions described in the foregoing embodiments may still be modified, or some technical features thereof are equivalently replaced. These modifications or replacements do not make the essence of the corresponding technical solutions depart from the spirit and scope of the technical solutions of the embodiments of this application.

What is claimed is:

1. A circuit board, comprising:
   a substrate including a radio frequency front-end circuit, a radio frequency back-end circuit, and a pad group, wherein the pad group comprises a first pad electrically connected to the radio frequency front-end circuit and a second pad electrically connected to the radio frequency back-end circuit, and the second pad is spaced apart from the first pad; and
   a liquid metal body arranged at a position of the pad group and connecting the first pad to the second pad, so as to electrically connect the radio frequency front-end circuit to the radio frequency back-end circuit.

2. The circuit board of claim 1, wherein the liquid metal body is arranged on a side of the pad group that is away from the substrate, and is in contact with the first pad and the second pad.

3. The circuit board of claim 2, wherein the first pad comprises a first pad surface on a side away from the substrate, and the second pad comprises a second pad surface on a side away from the substrate, and wherein the liquid metal body has a layered structure, and is laminated with the first pad surface and the first second pad surface.

4. The circuit board of claim 3, wherein the first pad surface is flush with the second pad surface.

5. The circuit board of claim 3, wherein the liquid metal body is flush with a side edge of the first pad surface that faces away from the second pad, and/or the liquid metal body is flush with a side edge of the second pad surface that faces away from the first pad.

6. The circuit board of claim 2, further comprising a first insulation layer that fills a gap between the first pad and the second pad.

7. The circuit board of claim 1, wherein the liquid metal body fills a gap between the first pad and the second pad.

8. The circuit board of claim 1, further comprising a second insulation layer arranged at a position of the liquid metal body to cover the liquid metal body.

9. The circuit board of claim 8, wherein the liquid metal body has a layered structure, and the second insulation layer is stacked on a side of the liquid metal body that is away from the substrate.

10. The circuit board of claim 8, wherein the second insulation layer is a heat curing adhesive layer or an ultraviolet curing adhesive layer.

11. The circuit board of claim 1, wherein the substrate includes a plurality of pad groups, wherein the pad groups of the plurality are arranged side by side.

12. The circuit board of claim 1, further comprising either a) a first shielding can that covers a region of the substrate provided with the radio frequency front-end circuit, or b) a second shielding can that covers a region of the substrate provided with the radio frequency back-end circuit.

13. The circuit board of claim 1, further comprising a first shielding can that covers a region of the substrate provided with the radio frequency front-end circuit, and a second shielding can that covers a region of the substrate provided with the radio frequency back-end circuit.

14. A terminal device, comprising:
    a housing;
    a circuit board arranged in the housing, the circuit board comprising:
       a substrate including a radio frequency front-end circuit, a radio frequency back-end circuit, and a pad group, wherein the pad group comprises a first pad electrically connected to the radio frequency front-end circuit and a second pad electrically connected to the radio frequency back-end circuit, and the second pad is spaced apart from the first pad; and
       a liquid metal body arranged at a position of the pad group and connecting the first pad to the second pad, so as to electrically connect the radio frequency front-end circuit to the radio frequency back-end circuit; and
    an antenna electrically connected to the radio frequency back-end circuit.

15. A method for manufacturing a circuit board, comprising:
    providing a substrate including a radio frequency front-end circuit, a radio frequency back-end circuit, and a pad group, wherein the pad group comprises a first pad electrically connected to the radio frequency front-end circuit and a second pad electrically connected to the radio frequency back-end circuit, and the second pad is spaced apart from the first pad;
    electrically connecting a test end of a radio frequency test instrument to the first pad, to test the radio frequency front-end circuit; and
    arranging a liquid metal body at a position of the pad group after the testing of the radio frequency front-end circuit is completed, to connect the first pad to the second pad, so as to electrically connect the radio frequency front-end circuit to the radio frequency back-end circuit.

16. The method of claim 15, wherein arranging the liquid metal body at the position of the pad group comprises arranging the liquid metal body on a side of the pad group that is away from the substrate, to enable the liquid metal body to be in contact with the first pad and the second pad.

17. The method of claim 16, wherein before arranging the liquid metal body on the side of the pad group that is away from the substrate, the method further comprises filling a gap between the first pad and the second pad with an insulating material, to form a first insulation layer.

18. The method of claim 16, wherein arranging the liquid metal body on the side of the pad group that is away from the substrate, to enable the liquid metal body to be in contact with the first pad and the second pad comprises:
    laminating a mask with a mask hole on an upper layer of the substrate, so that the pad group is located in the mask hole; and coating the mask hole with a liquid metal material, to form the liquid metal body on the side that is of the pad group that is away from the substrate.

19. The method of claim 15, wherein arranging the liquid metal body at the position of the pad group comprises filling a gap between the first pad and the second pad with a liquid metal material, to form the liquid metal body.

20. The method of claim 19, wherein filling the gap between the first pad and the second pad with the liquid metal material comprises:
  laminating a mask with a mask hole on an upper layer of the substrate, so that the pad group is located in the mask hole; and
  coating the mask hole with a liquid metal material, to form the liquid metal body in the gap between the first pad and the second pad.

* * * * *